United States Patent
Omichi et al.

(10) Patent No.: US 8,268,075 B2
(45) Date of Patent: Sep. 18, 2012

(54) METHOD OF PRODUCING ZINC OXIDE SEMICONDUCTOR CRYSTAL

(75) Inventors: Koji Omichi, Sakura (JP); Yoshikazu Kaifuchi, Sakura (JP); Munehisa Fujimaki, Sakura (JP); Akihiko Yoshikawa, Chiba (JP)

(73) Assignees: Fujikura Ltd., Tokyo (JP); Chiba University, Chiba (JP)

( * ) Notice: Subject to any disclaimer, the term of this patent is extended or adjusted under 35 U.S.C. 154(b) by 734 days.

(21) Appl. No.: 12/305,802

(22) PCT Filed: Jun. 22, 2007

(86) PCT No.: PCT/JP2007/062634
§ 371 (c)(1),
(2), (4) Date: Feb. 24, 2009

(87) PCT Pub. No.: WO2007/148802
PCT Pub. Date: Dec. 27, 2007

(65) Prior Publication Data
US 2009/0260563 A1 Oct. 22, 2009

(30) Foreign Application Priority Data
Jun. 22, 2006 (JP) .................................. 2006-172613

(51) Int. Cl.
*C30B 23/00* (2006.01)
*C30B 25/00* (2006.01)
*C30B 28/12* (2006.01)
*C30B 28/14* (2006.01)

(52) U.S. Cl. ............................ 117/84; 117/108; 117/109

(58) Field of Classification Search ................. 117/2, 84, 117/108, 109
See application file for complete search history.

(56) References Cited

U.S. PATENT DOCUMENTS

| 2002/0034861 A1* | 3/2002 | Iwata et al. ................... 438/483 |
| 2006/0183625 A1* | 8/2006 | Miyahara ...................... 501/98.4 |
| 2008/0093621 A1* | 4/2008 | Takeda et al. ................. 257/103 |

FOREIGN PATENT DOCUMENTS

| JP | 57-092827 | 6/1982 |
| JP | 63-160343 A | 7/1988 |
| JP | 2004-269338 A | 9/2004 |
| JP | 2005-537644 A | 12/2005 |

(Continued)

OTHER PUBLICATIONS

A. Tsukazaki, et al, "Layer-By-Layer Growth of High-Optical-Quality ZnO Film on Atomically Smooth and Lattice Relaxed ZnO Buffer Layer", Applied Physics Letters, Oct. 6, 2003, p. 2784-2786, Vol. 83, No. 14.

(Continued)

*Primary Examiner* — James McDonough
(74) *Attorney, Agent, or Firm* — Sughrue Mion, PLLC (57) ABSTRACT

A method of producing a zinc oxide-based semiconductor crystal, including: introducing at least zinc and oxygen on a surface of a substrate; and growing a zinc oxide-based semiconductor crystal on the substrate, wherein a total or partial portion of the zinc is ionized in a vacuum atmosphere of $1\times10^{-4}$ Torr or less and is introduced to the surface of the substrate to grow the ZnO based semiconductor crystal. As a result, it is possible to provide a method of producing a zinc oxide based semiconductor crystal capable of growing a zinc oxide semiconductor crystal having excellent surface flatness and crystallinity and including an extremely small amount of impurities at a high growth rate.

5 Claims, 6 Drawing Sheets

FOREIGN PATENT DOCUMENTS

WO        2004/020686 A2    3/2004

OTHER PUBLICATIONS

Ken Nakahara, et al, "Growth of Undoped ZnO Films With Improved Electrical Properties by Radical Source Molecular Beam Epitaxy", Japanese Journal of Applied Physics, Jan. 2001, p. 250-254, Vol. 40.

Kakuei Matsubara, et al, "Properties of ZnO Films Prepared by Reactive Ionized Cluster Beam Deposition", Surface Science, 1979, p. 290-299, Vol. 86.

Office Action dated Mar. 13, 2012 issued in Japanese Patent Application No. 2008-522555.

* cited by examiner

METHOD OF PRODUCING ZINC OXIDE SEMICONDUCTOR CRYSTAL

TECHNICAL FIELD

The present invention relates to a method of producing a zinc oxide semiconductor crystal, which enables a zinc oxide based semiconductor crystal having excellent surface flatness and crystallinity and including extremely small amount of impurities to grow at a high growth rate.

Priority is claimed on Japanese Patent Application No. 2006-172613 dated Jun. 22, 2006, the content of which is incorporated herein by reference.

BACKGROUND ART

Zinc oxide (hereinafter referred to as ZnO) based semiconductor crystals as a novel crystalline material have attracted considerable attention as an alternative to III-V group nitride semiconductor crystal used in blue-light emitting devices, ultraviolet light emitting devices or the like.

Here, a ZnO-based semiconductor crystal includes a non-doped ZnO, ZnO-based mixed crystal such as zinc magnesium oxide (ZnMgO), zinc cadmium oxide (ZnCdO), ZnO or a ZnO-based mixed crystal that are doped with gallium (Ga), nitrogen (N) or the like and show a specific electronic conductivity.

In order to realize blue-light emitting devices or ultraviolet light emitting devices using the ZnO-based semiconductor crystal, the ZnO-based semiconductor crystal, the ZnO-based semiconductor crystal is required to have an excellent surface flatness and excellent crystallinity.

For example, techniques described in Non Patent References 1 to 3 have been conventionally proposed so as to satisfy the above-described requirements.

Non-Patent Reference 1 describes a growth of a non-doped ZnO semiconductor crystal (hereinafter referred to as ZnO crystal) at a very high crystal growth temperature (substrate temperature) using a laser molecular beam epitaxy (laser MBE) apparatus. Specifically, a ZnO crystal of excellent surface flatness and crytsallinity is realized by crystal growth on a substrate (in Non-Patent Reference 1, a scandium aluminum magnesium oxide substrate) heated at 800° C. by ablation of sintered ZnO as a raw material using a krypton fluoride (KrF) excimer laser.

On the other hand, a molecular beam epitaxy (MBE) method is known as an alternative method for growing a ZnO crystal of high quality. For example, Non-Patent Reference 2 describes a general method of growing a ZnO crystal by the MBE method. In the method described in Non-Patent Reference 2, by heating a Knudsen cell filled with solid zinc (Zn), the solid Zn is partially evaporated and is introduced to the surface of a substrate (in Non-Patent Reference 2, a sapphire substrate). At the same time, radicalized oxygen (O radical) gas is introduced to the surface of the substrate from a different side. Thus, ZnO crystal is grown by a reaction between Zn and O radical on the surface of the substrate. In the MBE method, it is possible to reduce the amount of impurities in the grown Zn crystal to an extremely low level by using highly pure solid Zn and $O_2$ gas as raw materials, and by maintaining the atmosphere of crystal growth in a high vacuum. In the MBE method, ZnO crystals are generally grown at a crystal growth temperature of about 600 to 700° C. (600° C. in Non-Patent Reference 2).

A reactive ion cluster beam (R-ICB) method is known as an alternative method of growing a ZnO crystal. Non-Patent Reference 3 describes a general method of growing a ZnO crystal in accordance with the R-ICB method. At the method described in Non-Patent Reference 3, Zn clusters (a state at which a plurality of Zn atoms are bonded by Van der Waals force) are formed by heating a solid Zn filled in a crucible and partially evaporating the solid Zn. The Zn clusters are partially or totally ionized ($Zn^+$) and introduced to a surface of a substrate (in Patent Reference 3, a glass substrate or a sapphire substrate). At the same time, $O_2$ gas is supplied through the passage for ionizing the Zn clusters. The $O_2$ gas is partially ionized ($O^-$) and is introduced to the surface of the substrate. Thus, a ZnO crystal is grown by a reaction of a $Zn(Zn^+)$ cluster and $O(O^-)$ on the surface of the substrate. In the R-ICB method, Zn clusters and O are ionized and introduced to the surface of the substrate, thereby enhancing their surface migration effect. As a result, it is possible to grow a ZnO crystal having a relatively good crystallinity at a low crystal growth temperature.

Non-Patent Reference 1: A. Tsukazaki et al., "Layer-by-layer growth of high-optical-quality ZnO film on atomically smooth and lattice relaxed ZnO buffer layer" Appl. Phys. Lett., 83 (2003), pp. 2784-2786.

Non-Patent Reference 2: K. Nakahara et al., "Growth of Undoped ZnO Films with Improved Electrical Properties by Radical Source Molecular Beam Epitaxy" Jpn. J. Appl. Phys., 40 (2001), pp. 250-254.

Non-Patent Reference 3: K. Matsubara et al., "PROPERTIES OF ZnO FILMS PREPARED BY REACTIVE IONIZED CLUSTER BEAM DEPOSITION" Surface Science, 86 (1979), pp. 290-299.

DISCLOSURE OF INVENTION

Problems to be Solved by the Invention

However, the method of growing a ZnO crystal disclosed in Non-Patent Reference 1 includes a problem in that impurities contained in the sintered ZnO as a raw material are captured in nearly the same proportion in grown ZnO crystal, resulting in growth of a ZnO crystal that includes much impurities.

In the method of growing a ZnO crystal disclosed in Non Patent Reference 2, crystal growth temperature is relatively low at about 600 to 700° C. Therefore, there is a problem in that it is difficult to obtain a surface flatness and crystallinity of a level required for realizing a light-emitting device. Where the crystal growth temperature is low, Zn that has reached on the surface of the substrate does not migrate sufficiently, tending to grow a crystal three-dimensionally. Since the thus three-dimensionally grown crystal is an agglomerate of grains, the crystal has rough surface flatness. In addition, such a crystal generally has low crytsallinity. As a method for improving surface flatness and crytsallinity in accordance with the MBE method, it is easy to consider performing crystal growth at a high growth temperature as disclosed in Non-Patent Reference 1. However, in the MBE method, because of high vapor pressures of Zn and O (O radical) as raw materials, Zn and O (O radical) introduced to the surface of the substrate are evaporated before reaction, and the growth rate of the crystal is remarkably decreased. As a result, it is very difficult to achieve a crystal film thickness required for realizing the light emitting device.

Further, in the method of growing ZnO crystal disclosed in Non-Patent Reference 3, since a very low crystal growth temperature of 300° C. or less is used, it is very difficult to achieve surface flatness and crystallinity of a level required for realizing a light emitting element. In accordance with Non-Patent Reference 3, crystallinity of ZnO depends on the crystal growth temperature. It is concluded that the optimum growth temperature is 230° C. when a sapphire substrate is used, and is 300° C. when a glass substrate is used. That is, it is believed that it is impossible to perform the crystal growth at a high temperature of about 800° C. to achieve a surface flatness and crystallinity at a level required for realizing a light emitting element.

In addition, Non-Patent Reference 3 describes that the vapor pressure of Zn supplied from the crucible is in the range of 0.1 to 1 Torr, and the partial pressure of O in the chamber is $5 \times 10^{-4}$ Torr or less. That is, Non-Patent Reference 3 includes a problem that large amount of impurities contaminate the crystal since the crystal growth is performed in a low vacuum atmosphere of about 0.1 to 1 Torr.

The present invention was carried out based on the consideration of the above-described circumstance, and an object of the present invention is to provide a method of producing a ZnO-based semiconductor crystal having excellent surface flatness and crystallinity and including an extremely small amount of impurities with a high crystal growth rate.

Devices for Solving the Problem

In order to achieve the above-described object, the present invention provides a method of producing a ZnO-based semiconductor crystal, comprising: introducing at least Zn and O on a surface of a substrate; and growing a ZnO-based semiconductor crystal on the substrate, wherein the total or partial portion of the Zn is ionized in a vacuum atmosphere of $1 \times 10^{-4}$ Torr or less and is introduced to the surface of the substrate to grow the ZnO-based semiconductor crystal.

In the method of producing a ZnO-based semiconductor crystal according to the present invention, it is preferable that the Zn for growing the ZnO-based semiconductor crystal is supplied in a mono-atomic state, the mono-atomic Zn is partially or totally ionized, the ionized Zn is accelerated by an application of electric voltage, and is introduced to the surface of the substrate.

In the method of producing a ZnO-based semiconductor crystal according to the present invention, it is preferable that a part or a whole of O for growing the ZnO-based semiconductor crystal is radicalized and is introduced to the surface of the substrate.

In the method of producing a ZnO-based semiconductor crystal according to the present invention, it is preferable to control the crystal growth temperature to be within a range of 400 to 1200° C.

In the method of producing a ZnO-based semiconductor crystal according to the present invention, it is preferable to control the crystal growth temperature to be within a range of 600 to 1200° C.

In the method of producing a ZnO-based semiconductor crystal according to the present invention, it is preferable that the ZnO-based semiconductor crystal is a non-doped ZnO crystal.

In the method of producing a ZnO-based semiconductor crystal according to the present invention, the above-described ZnO-based semiconductor crystal may include one or more elements selected from a group consisting of magnesium (Mg), cadmium (Cd), sulfur (S), selenium (Se), and tellurium (Te) for controlling its band-gap.

In the method of producing a ZnO-based semiconductor crystal according to the present invention, the above-described ZnO-based semiconductor crystal may include one or more elements selected from the group consisting of boron (B), aluminum (Al), gallium (Ga), indium (In), nitrogen (N), phosphorus (P), arsenic (As), hydrogen (H), lithium (Li), sodium (Na), and potassium (K) for controlling its conductivity.

In the method of producing a ZnO-based semiconductor crystal according to the present invention, the above-described ZnO-based semiconductor crystal may include one or more elements selected from the group consisting of Mg, Cd, S, Se, and Te for controlling its band-gap, and include one or more elements selected from the group consisting of B, Al, Ga, In, N, P, As, H, Li, Na, and K for controlling its conductivity.

Effect of the Invention

In the method of producing a ZnO-based semiconductor crystal according to the present invention, a part or a whole of Zn is ionized under a vacuum atmosphere of $1 \times 10^{-4}$ Torr or less, and is introduced to the surface of the substrate to grow a ZnO-based semiconductor crystal. Therefore, it is possible to provide a ZnO-based semiconductor crystal that grows at a high growth rate, has excellent surface flatness and crystallinity, and includes an extremely small amount of impurities in the crystal.

In the production method according to the present invention, it is possible to ensure the above-described effect by supplying Zn for growing the above-described ZnO-based semiconductor crystal at a mono-atomic state, partially or totally ionizing the mono-atomic Zn, accelerating the ionized Zn by applying electric voltage, thereby introducing the Zn to the surface of the substrate.

In the production method according to the present invention, by partially or totally radicalizing the O for growing the ZnO-based semiconductor crystal and introducing the O radical to the surface of the substrate, it is possible to further enhance the growth rate of the ZnO-based semiconductor crystal.

In the production method according to the present invention, it is possible to provide a ZnO-based semiconductor crystal having more excellent surface flatness and crystallinity by controlling the crystal growth temperature to be 400 to 1200° C., preferably 600 to 1200° C.

In the production method according to the present invention, the above-described effect can be ensured where the grown ZnO-based semiconductor crystal is a non-doped ZnO crystal.

In the production method according to the present invention, it is possible to obtain the above-described effect, even when the grown ZnO-based semiconductor crystal contains one or more elements selected from the group consisting of Mg, Cd, S, Se, and Te for controlling its band-gap.

In the production method according to the present invention, it is possible to obtain the above-described effect, even when the grown ZnO-based semiconductor crystal contains one or more element selected from a group consisting of B, Al, Ga, In, N, P, As, H, Li, Na, and K for controlling its conductivity.

In the production method according to the present invention, it is possible to obtain the above-described effect, even when the grown ZnO-based semiconductor crystal contains one or more elements selected from the group consisting of Mg, Cd, S, Se, and Te for controlling its band-gap, and further contains one or more element selected from a group consisting of B, Al, Ga, In, N, P, As, H, Li, Na, and K for controlling its conductivity.

EXPLANATION OF SYMBOLS

1: Crystal growth apparatus, 2: Crystal growth chamber, 3: Substrate holder, 4: manipulator, 5: Vacuum exhaust port, 6: Vacuum pump system, 7: Knudsen cell, 8: Ionizing mechanism, 9: RF radical cell, 10: $O_2$ gas supply system, 11: RF electric power supply system, 12: substrate, 21: Crystal growth apparatus, 22: Crystal growth chamber, 23: Substrate holder, 24: manipulator, 25: Vacuum exhaust port, 26: Vacuum pump system, 27: Knudsen cell, 28: Ionizing mechanism, 29: RF radical cell, 30: $O_2$ gas supply system, 31: RF electric power supply system, 32a: sapphire substrate, 33: insulator, 42: stabilized DC power supply, 43: High voltage power supply system, 44: High voltage power supply system, 51: Filament, 52: Collector, 53: Grid.

BEST MODE FOR CARRYING OUT THE INVENTION

In the following, embodiments of the present invention are explained with reference to the drawings.

Figure 1:
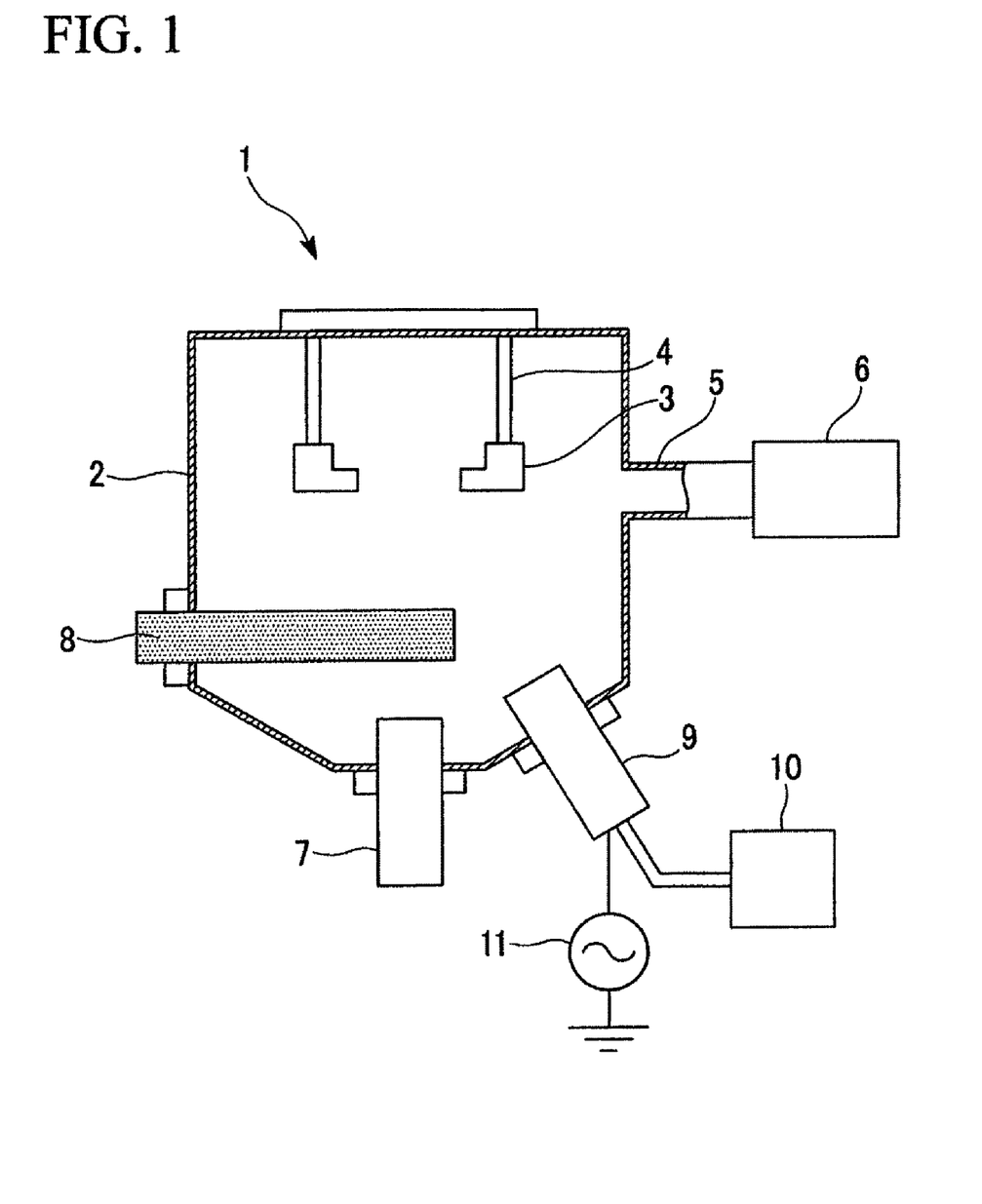
FIG. 1 is a schematic diagram showing an example of a crystal growth apparatus that is appropriately used in an embodiment of a production method according to the present invention.

FIG. 1 is a schematic view of a crystal growth apparatus for explaining an embodiment of a method of producing a ZnO-based semiconductor crystal according to the present invention. The crystal growth apparatus 1 includes a growth chamber 2, a substrate holder 3 disposed in the growth chamber 2, a manipulator 4 for holding the substrate holder 3, a substrate heating device (not shown), a vacuum pump system 6 connected to the vacuum exhaust port 5 provided to the chamber 2, a Knudsen cell 7, an ionizing mechanism 8, a high-frequency (RF) radical cell 9, an $O_2$ gas supply system 10, and a RF power supply system 11.

The substrate heating device heats a substrate (not shown) placed on the substrate-holder 3 to a predetermined crystal growth temperature. The vacuum pump system 6 evacuates the gas in the growth chamber 2 through the vacuum exhaust port 5 to achieve a ultra-high vacuum atmosphere in the growth chamber 2. A tip end of the Knudsen cell 7 is inserted in the growth chamber in an arrangement opposed to the substrate to evaporate the solid Zn filled in the Knudsen cell 7. The ionizing mechanism 8 is disposed between the Knudsen cell 7 and the substrate holder 3 to ionize a part or a whole of the evaporated Zn. A tip of the RF radical cell is inserted in the growth chamber 2 in an arrangement opposed to the substrate and radicalizes $O_2$ gas. The $O_2$ gas supply system 10 supplies highly pure $O_2$ gas to the RF radical cell 9. The RF power supply system 11 generates a high frequency voltage in the RE radical cell 9.

Figure 2:
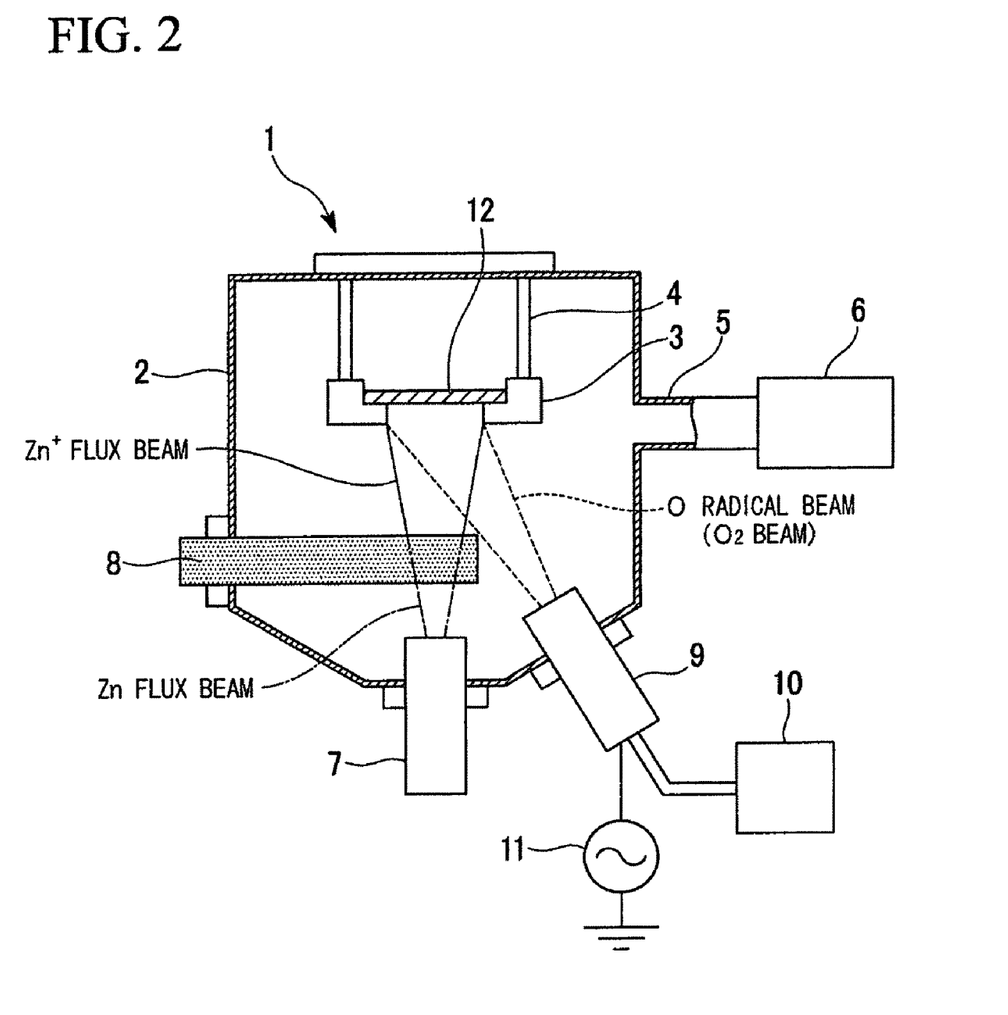
FIG. 2 is a schematic diagram showing an example of a production method according to the present invention.

Next a method of producing a ZnO-based semiconductor crystal using this crystal growth apparatus 1 is explained with reference to FIG. 2.

Firstly, a substrate 12 is placed on the substrate holder 3. After evacuating the interior of the growth chamber 2 to an ultra-high vacuum atmosphere of $1\times10^{-7}$ Torr or less, preferably $1\times10^{-9}$ Torr or less, the substrate 12 is heated by the substrate heating device at a temperature range of 600 to 1200° C.

The substrate 12 placed on the substrate holder may be made of any material provided that the material is physically and chemically stable at a crystal growth temperature of 600 to 1200° C. and that a ZnO-based semiconductor crystal may be grown on the surface of the substrate. It is preferable to use a substrate having a lattice constant similar to the ZnO-based semiconductor crystal, or a substrate having lattice constant with a lattice mismatch within ±20% with ZnO-based semiconductor crystal. For example, a substrate having such a lattice constant may be selected from a ZnO substrate, a sapphire substrate, or a aluminum magnesium scandium oxide substrate.

Next, by heating the Knudsen cell 7 so as to evaporate a desired amount of Zn filled in the Knudsen cell 7 to generates a flux beam composed of mono-atomic Zn (mono-atomic denotes a state where, different from a cluster state, evaporated Zn atoms are not bonded to each other). At that time, by generating appropriate currents and voltages in respective parts (described below) of the ionizing mechanism 8, a part or a whole of the mono-atomic Zn is ionized and constitutes $Zn^+$ flux beam, accelerated by applying an electric voltage, and is introduced to the surface of the substrate 12. At the same time, highly pure $O_2$ gas is supplied from the $O_2$ gas supplying system to the RF radical cell 9, such that $O_2$ gas beam is introduced to the surface of the substrate 12. At that time, it is possible to energize the RF power supply system 11 and radicalize the highly pure $O_2$ gas in the radical cell 9, and introduce the O radical beam to the surface of the substrate 12. By using the O radical beam, it is possible to enhance the growth rate of the ZnO based semiconductor crystal.

Even when the $Zn^+$ flux and $O_2$ or O radical are introduced into the growth chamber 2, the high vacuum atmosphere of $1\times10^{-4}$ Torr is maintained. In the following, a vacuum state where the $Zn^+$ flux and $O_2$ or O radical are introduced into the growth chamber 2 is referred to as a process vacuum so as to be distinguished from the vacuum state where the above-described gasses are not introduced into the chamber.

By thus introducing the $Zn^+$ flux and $O_2$ or O radical to the surface of the substrate 12, ZnO crystal grows as a result of reaction of the gasses.

EXAMPLES

Next, a method of producing a ZnO-based semiconductor crystal is explained in detail in Examples 1 to 5 based on the above-described embodiment. Although Examples 1 to 5 exemplify the present invention, the present invention is not limited to those Examples.

Example 1

Figure 3:
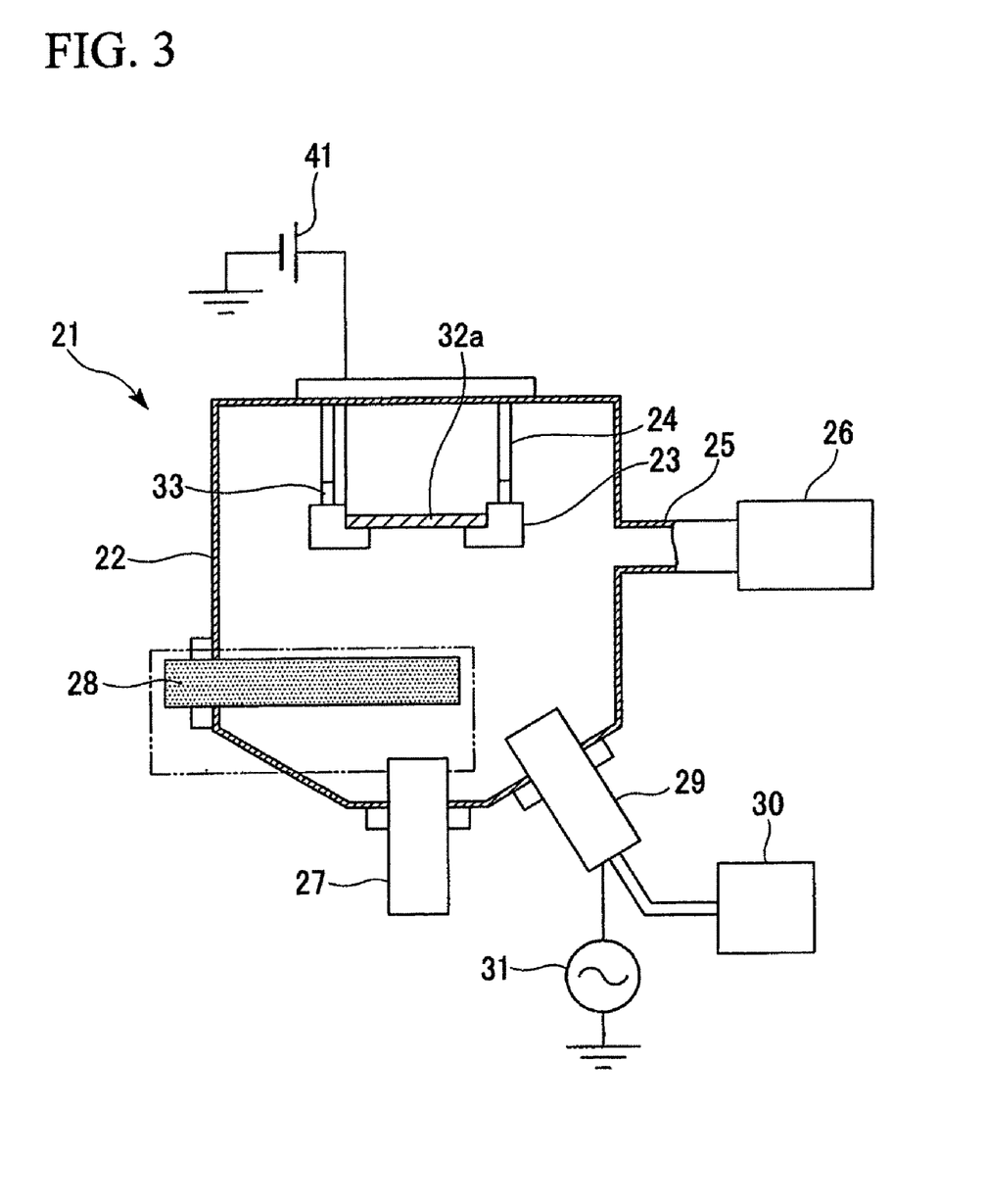
FIG. 3 is a schematic diagram showing a production method of Example 1.

FIG. 3 is a schematic diagram of a crystal growth apparatus for performing Example 1. Although the constitution of the apparatus is explained below, the explanation is omitted for constitutions similar to those explained in FIG. 1.

The crystal growth apparatus 21 includes a growth chamber 22, a substrate holder 23, a manipulator 24, a substrate heating device (not shown), a vacuum exhaust port 25, a pump system 26, a Knudsen cell 27, an ionizing mechanism 28, a RF radical cell 29, an $O_2$ gas supply system 30, and a RF power supply system 31.

In this crystal growth apparatus 21, the manipulator 24 is inserted with an insulator 33 that insulates the substrate holder 23 and growth chamber 22. The apparatus is constituted such that an electric voltage can be applied to the substrate holder 23 by the high-voltage power supply system 41 disposed outside the growth chamber 22.

Figure 4:
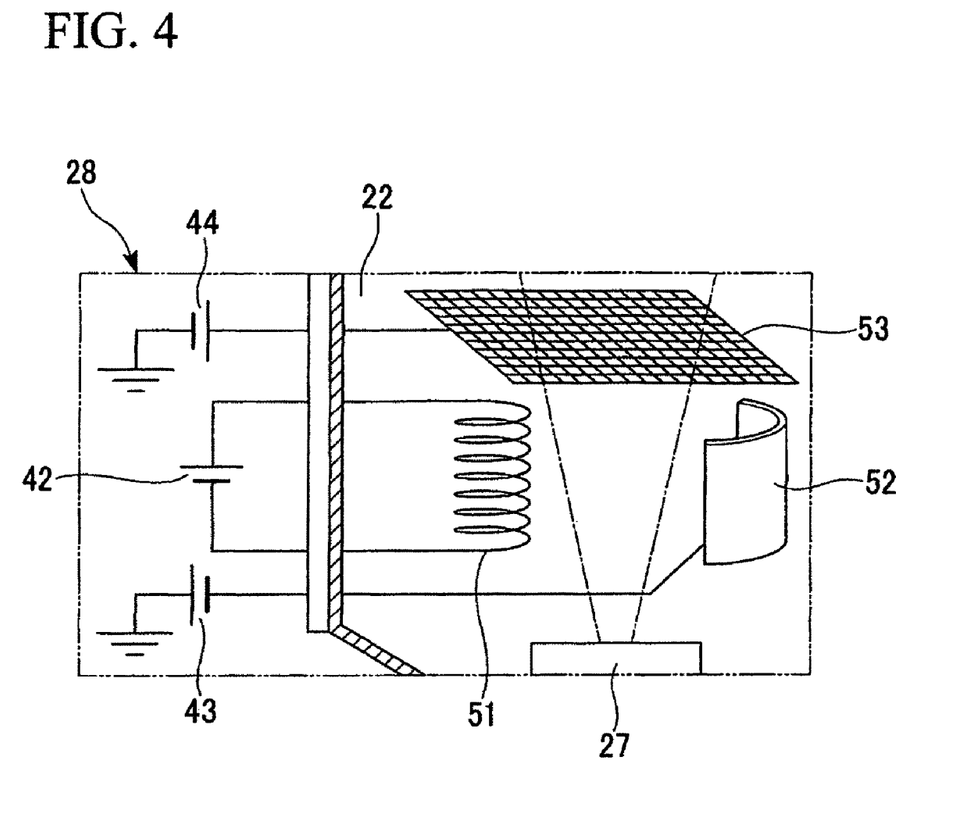
FIG. 4 is a schematic diagram showing details of an ionizing mechanism of Example 1.

Next, the ionizing mechanism 28 is explained in detail. FIG. 4 is a schematic diagram showing the detail of the ionizing mechanism 28. The ionizing mechanism 28 includes a filament 51 that emits thermoelectrons, a collector (anode) 52 that attracts the thermoelectrons, a grid (cathode) 53 that extracts ionized Zn ($Zn^+$) ionized by collision of the thermoelectrons, a stabilized DC power supply system 42 that energize electric current in the filament 51, a high voltage power supply system 43 that provides positive potential to the collector 52, and a high voltage power supply system 44 that provides negative potential to the grid 53. An insulator is inserted to a predetermined position of each of the filament 51, collector 52, and grid 53 to insulate each of them from the growth chamber 22. The stabilized DC power supply system 42, and high pressure power supply systems 43 and 44 are disposed outside the growth chamber 22, and are each connected to the filament 51, the collector 52, or the grid 53 in the growth chamber 22 through a withstand feed-through connector (not shown).

Next, a method of producing a ZnO-based semiconductor crystal using the crystal growth apparatus 21 is explained in detail.

A sapphire substrate 32a of 10 mm square and 0.35 mm in thickness was prepared. The substrate was placed on the substrate holder 23, and the interior of the growth chamber 22 was evacuated to an ultra-high vacuum atmosphere of $5 \times 10^{-10}$ Torr. Orientation of the crystal plane of the sapphire substrate 32a was (0001). The below described sapphire substrates also have this crystal plane orientation.

Next, thermal cleaning of the sapphire substrate was performed by heating the sapphire substrate to 770° C. for 30 minutes in an ultra-high vacuum atmosphere of $1 \times 10^{-9}$ Torr.

Next, a ZnO low-temperature deposition buffer layer was grown on the surface of the sapphire substrate 32a under the crystal growth temperature, the amount of Zn flux, the $O_2$ gas flow rate, and the RF input power shown in Table 1. Growth time was 12 minutes. In this case, process vacuum degree in the growth chamber 22 was $1.0 \times 10^{-5}$ Torr.

TABLE 1

| ITEM | CONDITIONS |
| --- | --- |
| Crystal growth temperature | 400° C. |
| Amount of Zn flux | $2.2 \times 10^{-7}$ Torr |
| Flow rate of $O_2$ gas | 0.8 sccm |
| RF input power | 200 W |
| Growth time | 12 minutes |
| Process vacuum degree | $1.0 \times 10^{-5}$ Torr |

Next, a ZnO crystal layer is grown on the sapphire substrate 32a having the ZnO low-temperature deposition buffer layer. During the crystal growth of the ZnO crystal layer, electric current and voltage are applied to the filament 51, the collector 52, the grid 53, and the substrate holder 23 as constituents of the ionizing mechanism 28, thereby generating a $Zn^+$ flux beam and introducing it to the surface of the sapphire substrate 32a.

Figure 5:
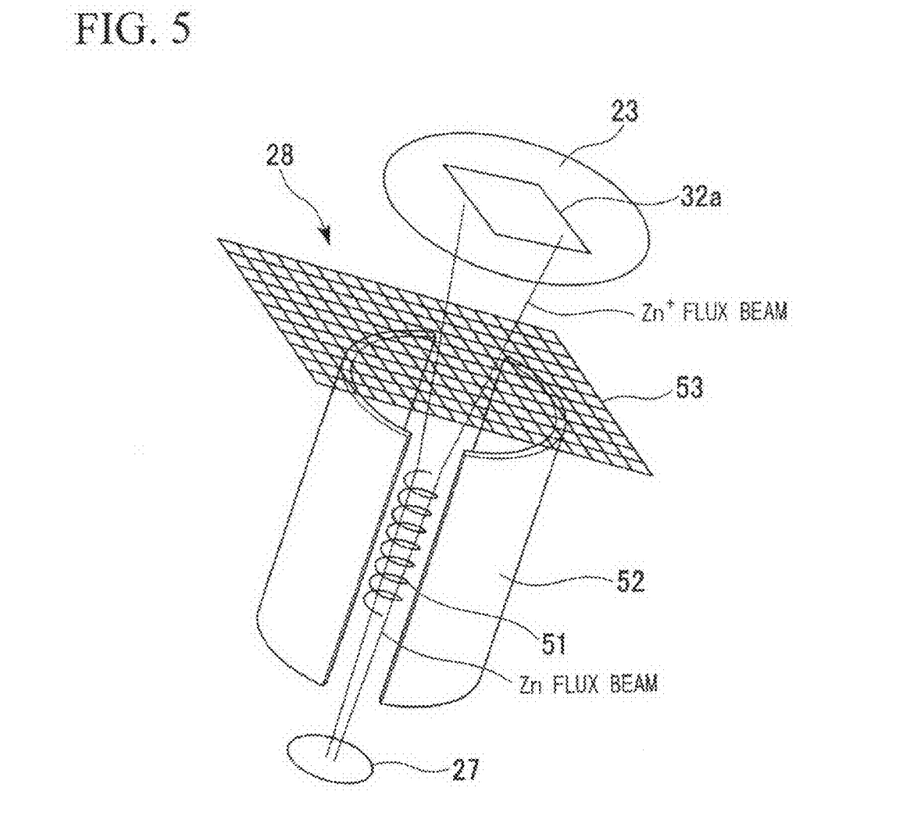
FIG. 5 is a perspective diagram schematically showing a principle of the ionizing mechanism of Example 1.

A method of generating the $Zn^+$ flux beam is explained in detail. FIG. 5 is a perspective diagram showing a process where Zn flux beam composed of mono-atomic Zn generated in the Knudsen cell 27 is partially or totally ionized to $Zn^+$ flux beam by the ionizing mechanism 28 and is introduced to the surface of the sapphire substrate 32a. Thermoelectrons are emitted from the filament 51, and the thermoelectrons are accelerated and attracted by the collector 52 as an anode.

While passing through the space between the filament 51 and the collector 52, the Zn flux beam generated from the Knudsen cell 27 collides with the thermoelectrons. A partial or total amount of mono-atomic Zn contained in the flux beam emit one electron or a plurality of electrons from the outermost shell and is ionized to $Zn^+$ or $Zn^{n+}$ (hereafter, referred to as $Zn^+$). Since the $Zn^+$ has a positive potential, the $Zn^+$ is attracted by the grid 53 as an cathode, and is further accelerated by the potential difference between the substrate holder 23 and the grid 53. Based on the above-described principle, the mono-atomic Zn partially or totally evaporated from the Knudsen cell 27 is partially or totally ionized, and the ionized Zn is further accelerated by applying the electric potential, and reaches the surface of the sapphire substrate 32a.

A ZnO crystal layer was grown on the surface of low-temperature deposition buffer layer under the crystal growth temperature, the amount of Zn flux, the $O_2$ gas flow rate, and the RF input power shown in Table 2. The growth time was 180 minutes. In this case, the process vacuum degree in the growth chamber 22 was $2.0 \times 10^{-5}$ Torr.

TABLE 2

| ITEM | CONDITIONS |
| --- | --- |
| Filament current | 4.8 A |
| Collector voltage | 100 V |
| Grid voltage | −400 V |
| Substrate voltage | −1000 V |
| Crystal growth temperature | 800° C. |
| Amount of Zn flux | $3.3 \times 10^{-7}$ Torr |
| $O_2$ gas flux | 1.2 sccm |
| RF input power | 300 W |
| Growth time | 180 minutes |
| Process vacuum degree | $2.0 \times 10^{-5}$ Torr |

After the crystal growth in the above-described processes, the sapphire substrate 32a was extracted from the crystal growth chamber 21. As a result of X-ray diffraction (XRD) analysis of the sapphire substrate, a diffraction pattern corresponding to ZnO (0002) was observed at about 34.4°. That is, it was ensured that the ZnO crystal was grown on the sapphire substrate. Based on the measurement of the film thickness by the cross section observation of it using a scanning electron microscope (SEM), the growth rate of the crystal was estimated to be 83 mm/h.

Comparative Example 1

A sapphire substrate 32b of 10 mm square and 0.35 mm in thickness was prepared. Thermal cleaning, growing of a ZnO low-temperature deposition buffer layer, and growing of a ZnO crystal layer were performed in accordance with a similar manner as in Example 1, whereas a $Zn^+$ flux beam was not generated and a normal Zn flux beam were used in the time of growing the ZnO crystal layer. The other growth conditions were similar to those of Example 1.

By XRD analysis, it was confirmed that the crystal grown on the sapphire substrate 32b was ZnO. Based on the measurement of the film thickness by cross sectional SEM observation, the growth rate of the crystal was estimated to be 72 nm/h.

Based on the comparison of the growth rate of Comparative Example 1 and the growth rate of Example 1, it was proved that the growth rate of ZnO crystal could be improved in accordance with Example 1.

Figure 6:
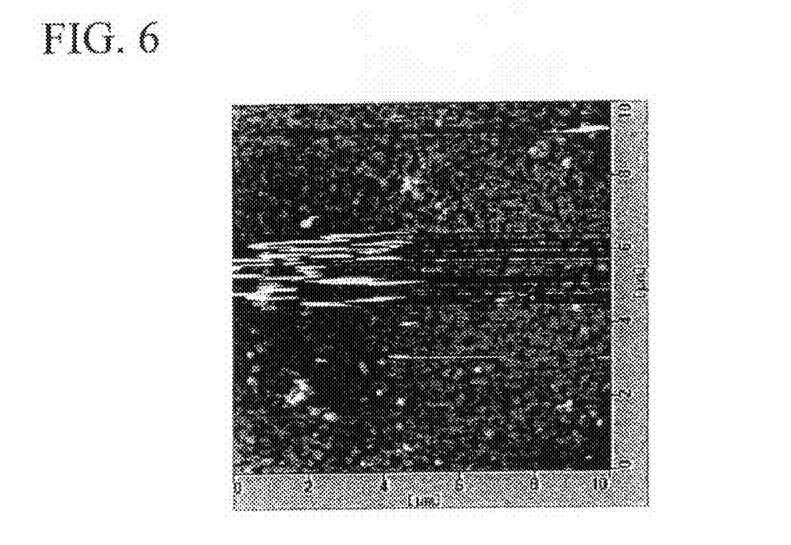
FIG. 6 is a surface morphology of the ZnO crystal of Example 1.
Figure 7:
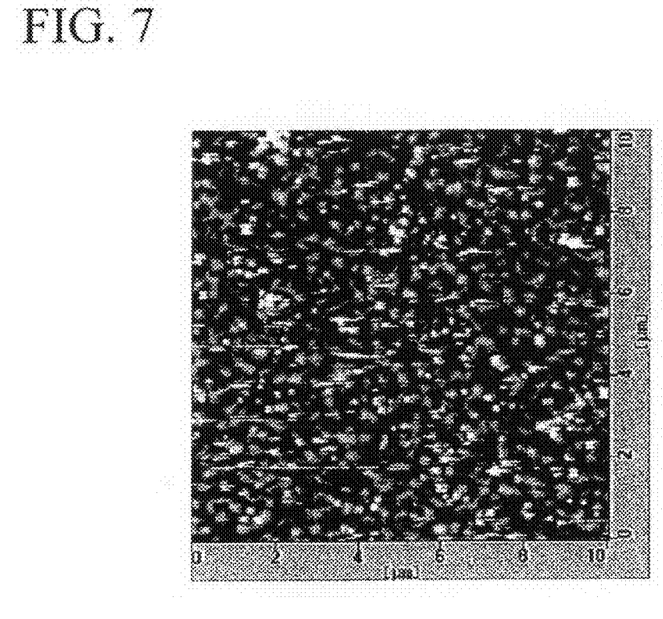
FIG. 7 is a surface morphology of the ZnO crystal of Comparative Example 1.

Next, the surface flatness of the thus grown ZnO crystals was compared. FIG. 6 shows a result of Example 1 and is a surface morphology of the ZnO crystal grown on the surface of the sapphire substrate 32a, where the surface morphology was observed by an atomic force microscope (AFM). FIG. 7 shows a result of Comparative Example 1 and is a surface morphology of the ZnO crystal grown on the surface of the sapphire substrate 32b.

The ZnO crystal of Comparative Example 1 had a low grain density and numerous grain boundaries were observed.

On the other hand, the ZnO crystal of Example 1 had a high density of ZnO grains and grain boundary regions were smaller than those of the ZnO crystal of Comparative Example 1. That is, as a constituent of a film, the ZnO crystal of Example 1 has a high textural continuity in the in-plane direction of the thin film, thus having excellent surface flatness, compared with the ZnO crystal of Comparative Example 1.

Next, crystallinities of ZnO crystals in Example 1 and Comparative Example 1 were compared. Table 3 shows a concentration of residual carriers of ZnO crystals obtained by Hall effect measurement.

TABLE 3

| Sample | Concentration of residual carriers |
| --- | --- |
| Example 1 | $1.03 \times 10^{-17}/cm^3$ |
| Comparative Example 1 | $1.17 \times 10^{-17}/cm^3$ |

As shown in Table 3, the ZnO crystal of Example 1 showed slightly lower residual carrier concentration than the ZnO crystal of Comparative Example 1. That is, the ZnO crystal of Example 1 has a good crystallinity compared to the ZnO crystal of Comparative Example 1.

Based on the above-described results, it was demonstrated that the surface flatness and crystallinity of ZnO crystal could be improved in Example 1 according to the present invention.

In Example 1, ionized ($Zn^+$) is applied with acceleration voltage of several eV to 1 keV and reaches the surface of the substrate. Therefore, $Zn^+$ migrates actively on the surface of the substrate. The activation of its migration enhances the possibility to get over the barrier of reaction potential to form ZnO by the reaction of Zn($Zn^+$) and O (O radical). As a result, it is considered that the crystal growth rate is enhanced. In addition, activation of its migration makes it easy for Zn ($Zn^+$) to move to the kink position, that is front of crystal growth. As a result, textural continuity in the in-plane direction of the thin film is enhanced (grain boundary region is reduced), and surface flatness is improved, and further resulting in improvement of crystallinity.

Example 2

A sapphire substrate 32c of 10 mm square and 0.35 mm in thickness was prepared and was subjected to thermal cleaning, growing of a ZnO low-temperature deposition buffer layer, and growing of a ZnO crystal layer. The growth temperature in the time of growing the ZnO crystal layer was 600° C., whereas the other conditions were the same as Example 1.

By the XRD analysis, it was confirmed that the crystal obtained on the substrate by the Example 2 was ZnO. Based on the measurement of the film thickness by cross sectional SEM observation, the growth rate of the crystal was estimated to be 160 nm/h.

Comparative Example 2

A sapphire substrate 32d of 10 mm square and 0.35 mm in thickness was prepared and was subjected to thermal cleaning, growing of a ZnO low-temperature deposition buffer layer, and growing of a ZnO crystal layer. A $Zn^+$ flux beam was not generated and a normal Zn flux beam was used at the time of growing the ZnO crystal layer. The other growth conditions were similar to those of Example 2.

By the XRD analysis, it was confirmed that the crystal obtained on the substrate by the Comparative Example 2 was ZnO. Based on the measurement of the film thickness by cross sectional SEM observation, the growth rate of the crystal was estimated to be 143 nm/h.

Example 3

A sapphire substrate 32e of 10 mm square and 0.35 mm in thickness was prepared and was subjected to thermal cleaning, growing of a ZnO low-temperature deposition buffer layer, and growing of a ZnO crystal layer. The growth temperature at the time of growing the ZnO crystal layer was 900° C., whereas the other conditions were the same as in Example 1.

By the XRD analysis, it was confirmed that the crystal obtained on the substrate by the Example 3 was ZnO. Based on the measurement of the film thickness by cross sectional SEM observation, the growth rate of the crystal was estimated to be 27 nm/h.

Comparative Example 3

A sapphire substrate 32f of 10 mm square and 0.35 mm in thickness was prepared and was subjected to thermal cleaning, growing of a ZnO low-temperature deposition buffer layer, and growing of a ZnO crystal layer. A $Zn^+$ flux beam was not generated and a normal Zn flux beam was used at the time of growing of the ZnO crystal layer. The other growth conditions were similar to those of Example 3.

By the XRD analysis, it was confirmed that the crystal obtained on the substrate by the Comparative Example 3 was ZnO. Based on the measurement of the film thickness by cross sectional SEM observation, the growth rate of the crystal was estimated to be 12 nm/h.

Example 4

A sapphire substrate 32g of 10 mm square and 0.35 mm in thickness was prepared and was subjected to thermal cleaning, growing of a ZnO low-temperature deposition buffer layer, and growing of a ZnO crystal layer. The growth temperature at the time of growing the ZnO crystal layer was 1000° C., whereas the other conditions were the same as in Example 1.

By the XRD analysis, it was confirmed that the crystal obtained on the substrate by the Example 4 was ZnO. Based on the measurement of the film thickness by cross sectional SEM observation, the growth rate of the crystal was estimated to be 11 nm/h.

Comparative Example 4

A sapphire substrate 32h of 10 mm square and 0.35 mm in thickness was prepared and was subjected to thermal cleaning, growing of a ZnO low-temperature deposition buffer layer, and growing of a ZnO crystal layer. A $Zn^+$ flux beam was not generated and a normal Zn flux beam was used in the time of growing the ZnO crystal layer. The other growth conditions were similar to those of Example 4.

By the XRD analysis, the diffraction pattern caused by ZnO could not be detected from the crystal grown on the substrate of Comparative Example 4. Based on the cross sectional SEM observation, the ZnO crystal was not grown on the sapphire substrate 32h.

Example 5

A sapphire substrate 32i of 10 mm square and 0.35 mm in thickness was prepared and was subjected to thermal cleaning, growing of a ZnO low-temperature deposition buffer layer, and growing of a ZnO crystal layer. The growth temperature at the time of growing the ZnO crystal layer was 1200° C., whereas the other conditions were the same as in Example 1.

By the XRD analysis, the diffraction pattern caused by ZnO could not be detected from the crystal grown on the substrate of Example 5. However, based on the measurement of the film thickness by cross sectional SEM observation, a layer was grown on the sapphire substrate 32i, where the layer was considered to be ZnO crystal. It is considered that the diffraction pattern caused by ZnO could not be detected by the XRD analysis because of the very thin thickness of the ZnO crystal layer.

Figure 8:
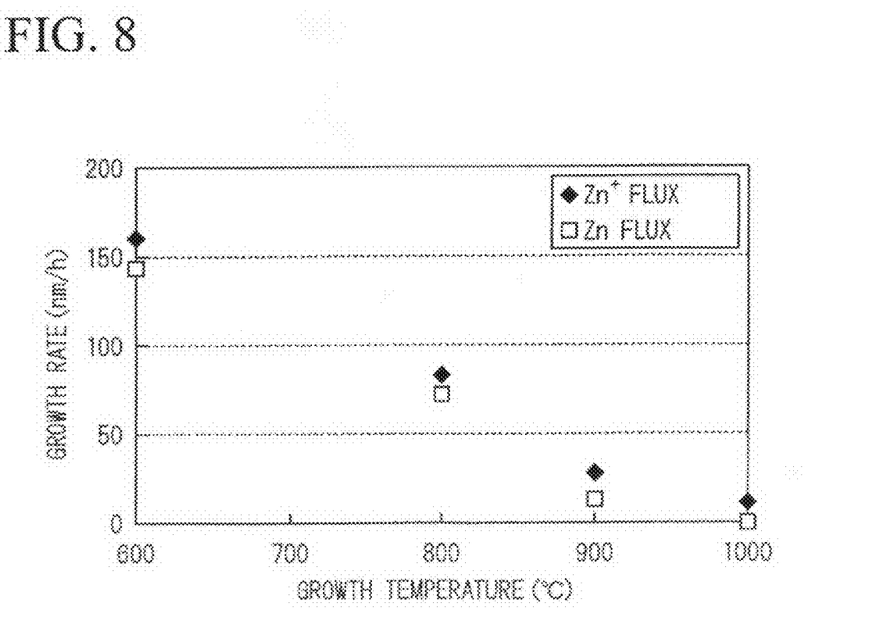
FIG. 8 is a graph for comparing the growth rates of ZnO crystal under the absence and presence of $Zn^+$ flux at a crystal growth temperature range of 600 to 1000° C.

Among the above-described Examples 1 to 5 and Comparative Examples 1 to 4, cross sectional SEM observation succeeded the measurement of film thickness where the crystal growth temperature was in the range of 600 to 1000° C. FIG. 8 is a graph showing the growth rates of ZnO crystal in this temperature range. In this figure, "$Zn^+$ flux" denotes the growth of ZnO crystal while generating $Zn^+$ flux beam. "Zn flux" denotes the growth of a ZnO crystal using a normal Zn flux beam without generating a $Zn^+$ flux beam. From this figure, it was confirmed that, at the same temperature, the use of $Zn^+$ flux beam enhanced the crystal growth rate. Especially, the crystal growth rate at 900° C. was twice compared to the case where a $Zn^+$ flux beam was not generated.

Where a $Zn^+$ flux beam was not generated, a ZnO crystal was grown only at a growth temperature of not higher than 900° C. On the other hand, a ZnO crystal was grown even at 1200° C. where a $Zn^+$ flux beam was generated.

As described above, according to the present invention, it is possible to provide a method of producing a ZnO-based semiconductor crystal having excellent surface flatness and crystallinity at a high growth rate.

In any case of the present invention, the process vacuum degree of the growth chamber is maintained to be $1 \times 10^{-4}$ Torr or less, and is preferably $2.0 \times 10^{-5}$ Torr or less. Therefore, it is possible to obtain a ZnO-based semiconductor crystal having a very small amount of impurities in the grown ZnO crystal.

In the present invention, it is preferable to control the crystal growth temperature to be in the range of 600 to 1200° C. Considering the effective achievement of practical thickness for producing the light emitting device, a crystal growth temperature within the range of 600 to 1000° C. is more preferred.

The present invention is clearly distinguished from Non-Patent References 1 and 2 in that Zn and $O_2$ gas are used as raw materials, Zn is partially or totally ionized, where necessary, $O_2$ is partially or totally radicalized and introduced to the surface of the substrate.

Non-Patent Reference 3 is mainly aimed at growth of a ZnO crystal at a low temperature of 300° C. or less by using ionized Zn cluster. On the other hand, in the present application, the high crystal growth temperature is used for growing a crystal having excellent surface flatness and crystallinity. Further, the present invention aims at further improving the surface flatness and crystallinity, thereby enhancing the crystal growth rate by the use of ionized Zn. Therefore, the principle of the present invention is basically different from the technique described in non-patent reference 3.

In Non-Patent Reference 3, Zn clusters are ionized and introduced to the surface of the substrate, where each cluster consists of 500 to 2000 Zn atoms and are positively charged by emitting one electron or a plurality of electrons.

In Non-Patent Reference 3, a large mass of the $Zn^+$ cluster is utilized as a driving force for growing ZnO crystal. On the other hand, in the present invention, mono-atomic Zn is ionized and given an acceleration energy by application of electric voltage, and this acceleration energy is used as a driving force for growing the ZnO crystal. The above-described mechanism is clearly different from Non-Patent Reference 3.

In addition, the present invention can be effectively applied not only to a case where the ZnO crystal is grown at high crystal growth temperature, but also to a case where a crystal is grown at relatively low temperature. For example, in the case of growing a ZnO low-temperature deposition buffer layer as explained in Example 1, it is possible to grow a ZnO low-temperature deposition buffer layer having a relatively flat surface by generating $Zn^+$ beam.

The ZnO low-temperature deposition buffer layer is introduced for improving a surface flatness and crystallinity of a ZnO crystal where the ZnO crystal is grown on a surface of a substrate such as sapphire substrate, scandium aluminum magnesium substrate, that exhibits lattice mismatch of ±20% or less compared to the ZnO crystal. As the ZnO low-temperature deposition buffer layer has a high surface flatness, the ZnO crystal grown on the buffer layer has improved surface flatness and crystallinity, that is, the present invention exhibits the effect.

Where the ZnO low-temperature deposition buffer layer is grown at a temperature lower than 400° C. or at a temperature higher than 600° C., the surface flatness and crystallinity of ZnO crystal grown on the buffer layer is deteriorated. Therefore, the ZnO low-temperature deposition buffer layer is preferably grown at a temperature in the range of 400 to 600° C.

While the above-describe embodiment is explained in the case of non-doped ZnO crystal, the present application is not limited to this embodiment. The present invention can be applied to a ZnO-based mixed crystal such as ZnMgO and ZnCdO, a ZnO crystal or a ZnO-based mixed phase having a specific conductivity by being doped with an element such as Ga and N.

More specifically, it is possible to use S, Se, Te or the like in addition to the above-described Mg and Cd as elements for forming the mixed crystal (that is, for controlling the bandgap). By mixing those elements to form a ZnO-based mixed crystal, it is possible to fabricate a double-hetero structure for changing wavelength of emitted light from the light emitting device or enhancing light emitting effect of the light emitting device.

As the elements for controlling conductivity, it is possible to use B, Al, In, P, As, H, Li, Na, and K in addition to the above-described Ga and N. By mixing those elements to provide the ZnO with a specific conductivity (p type and n type), it is possible to fabricate a hetero (p-n) junction for realizing the light emitting device.

A single species selected from the above-described elements may be included in a ZnO crystal constituting a base material. Two or more elements may be included. In addition, the elements for controlling its band-gap and the elements for controlling its conductivity may be included simultaneously.

By using the present invention in the case of growing the above-explained ZnO based mixed crystal or ZnO or ZnO based mixed crystal showing specific conductivity, it is possible to provide a crystal exhibiting high growth rate, having excellent surface flatness and crystallinity, and including very small amount of impurities within the crystal (where impurities denotes elements contaminating the crystal without intention).

INDUSTRIAL APPLICABILITY

According to the present invention, it is possible to provide a method of producing a ZnO-based semiconductor crystal exhibiting a high growth rate, having excellent surface flatness and crystallinity, and including a very small amount of impurities within the crystal.

The invention claimed is:

1. A method of producing a zinc oxide-based semiconductor crystal, comprising: introducing at least zinc and oxygen on a surface of a substrate; and growing a zinc oxide based semiconductor crystal on a surface of the substrate, wherein
   the zinc for growing the zinc oxide-based semiconductor crystal is supplied in a mono-atomic state,
   a total or partial portion of the zinc is ionized in a vacuum atmosphere of $1 \times 10^4$ Torr or less,
   the ionized zinc is given an acceleration energy by an application of electric voltage and is introduced to the surface of the substrate to grow the ZnO-based semiconductor crystal,
   a part or a whole of oxygen for growing the zinc oxide-based semiconductor crystal is radicalized and is introduced to the surface of the substrate, and
   the zinc oxide-based semiconductor crystal is grown at a crystal growth temperature within a range of 800 to 1200° C.

2. The method of producing a zinc oxide-based semiconductor crystal according to claim 1, wherein the zinc oxide-based semiconductor crystal is a non-doped zinc oxide crystal.

3. The method of producing a zinc oxide-based semiconductor crystal according to claim 1, wherein the zinc oxide-based semiconductor crystal includes at least one or more element selected from a group consisting of magnesium, cadmium, sulfur, selenium, tellurium for controlling its band-gap.

4. The method of producing a zinc oxide-based semiconductor crystal according to claim 1, wherein the zinc oxide-based semiconductor crystal includes at least one or more element selected from a group consisting of boron, aluminum, gallium, indium, nitrogen, phosphorus, arsenic, hydrogen, lithium, sodium, and potassium for controlling its conductivity.

5. The method of producing a zinc oxide-based semiconductor crystal according to claim 1, wherein the zinc oxide-based semiconductor crystal include at least one or more element selected from a group consisting of magnesium, cadmium, sulfur, selenium, and tellurium for controlling its band-gap, and includes one or more element selected from a group consisting of boron, aluminum, gallium, indium, nitrogen, phosphorus, arsenic, hydrogen, lithium, sodium, and potassium for controlling its conductivity.

* * * * *